United States Patent [19]
Kolze et al.

[11] Patent Number: 5,900,742
[45] Date of Patent: May 4, 1999

[54] INTERFACE CELL FOR A PROGRAMMABLE INTEGRATED CIRCUIT EMPLOYING ANTIFUSES

[75] Inventors: Paige A. Kolze; William D. Cox; Kevin K. Yee, all of San Jose, Calif.

[73] Assignee: QuickLogic Corporation, Sunnyvale, Calif.

[21] Appl. No.: 08/667,783

[22] Filed: Jun. 21, 1996

[51] Int. Cl.$^6$ .............................................. H03K 19/177
[52] U.S. Cl. ............................................... 326/41; 326/40
[58] Field of Search ................................ 326/38–41, 47, 326/40

[56] References Cited

U.S. PATENT DOCUMENTS

| | | | |
|---|---|---|---|
| 4,758,746 | 7/1988 | Birkner et al. ......................... | 326/38 X |
| 4,763,020 | 8/1988 | Takata et al. .......................... | 326/38 X |
| 4,771,285 | 9/1988 | Agrawal et al. ....................... | 326/38 X |
| 5,220,213 | 6/1993 | Chan et al. ............................. | 326/40 |
| 5,302,546 | 4/1994 | Gordon et al. ......................... | 437/170 |
| 5,416,367 | 5/1995 | Chan et al. ............................. | 326/44 |
| 5,424,655 | 6/1995 | Chua ...................................... | 326/40 |
| 5,495,181 | 2/1996 | Kolze ..................................... | 326/38 |
| 5,502,315 | 3/1996 | Chua et al. .............................. | 257/50 |
| 5,504,439 | 4/1996 | Tavana ................................... | 326/38 |
| 5,625,301 | 4/1997 | Plants et al. . | |

OTHER PUBLICATIONS

S. Trimberger, "Field Programmable Gate Array Technology", pp. 1–14 and 98–170, (1994).
S. Brown et al., "Field Programmable Gate Arrays", pp. 1–43 and 88–202, (1992).
D. Pellerin and M. Holley, "Practical Design Using Programmable Logic" pp. 84–98, (1991).
Advanced Micro Device, PAL Device Data Book and Design Guide, pp. 2–236 through 2–247, (1993).
Quicklogic Data Book, pp. 1–5 through 2–11 and 6–3 through 6–18, (1995).
Actel FPGA Data Book and Design Guide, pp. ix–xv, 1–5 through 1–34, 1–51 through 1–101, 1–153 through 1–222, 3–1 through 4–56, (1995).
C. Erickson, et al., "Logic Cell Array", The Programmable Gate Array Design Book, First Edition, pp. 1–9 through 2–73, (1986).

*Primary Examiner*—Hoanganh Le
*Assistant Examiner*—Hoang Nguyen
*Attorney, Agent, or Firm*—Skjerven, Morrill, MacPherson, Franklin & Friel LLP

[57] ABSTRACT

An interface cell for a programmable integrated circuit includes a pad, an input buffer, a first routing conductor, a plurality of second routing conductors, and a plurality of antifuses. The input of the input buffer is coupled to the pad and the output of the input buffer is coupled to the first routing conductor so that an input signal from the pad can be supplied onto the first routing conductor without passing through any programmed antifuses. The second routing conductors extend parallel to one another in a direction perpendicular to the direction in which the first routing conductor extends. The second routing conductors cross the first routing conductor and then pass out of the interface cell and into a routing channel of the programmable integrated circuit. One of the antifuses is disposed at each location where one of the second routing conductors crosses the first routing conductor. Accordingly, an input signal from the pad can be supplied onto any desired one of the second routing conductors of the routing channel by programming only one antifuse. The interface cell contains an enablable register, the control inputs of which can be independently driven from any conductor in the adjacent routing channel. Combinatorial and registered outputs of the interface cell can be simultaneously routed to the routing channel and some interface cell outputs have 2× drive strength.

28 Claims, 14 Drawing Sheets

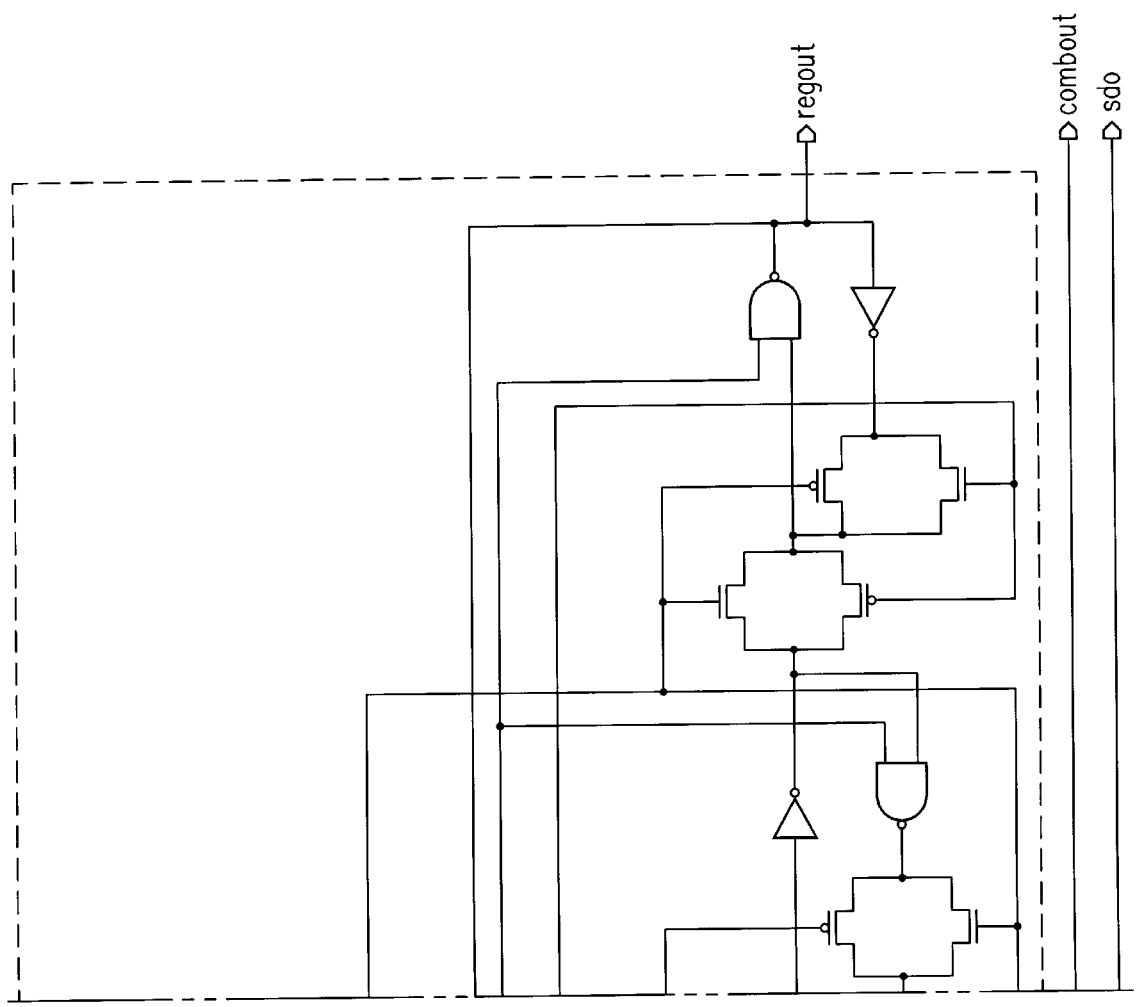

INTERFACE CELL FOR A PROGRAMMABLE INTEGRATED CIRCUIT EMPLOYING ANTIFUSES

FIELD OF THE INVENTION

This invention relates to programmable application specific integrated circuits (ASICs), and more particularly, to an interface cell of a field programmable gate array (FPGA) employing antifuses.

BACKGROUND INFORMATION

A field programmable gate array (FPGA) is a versatile integrated circuit, the internal circuitry of which may be configured by an individual user to realize a user-specific circuit. To configure an FPGA, the user configures an on-chip interconnect structure of the FPGA so that selected inputs and selected outputs of selected on-chip logic elements are connected together in such a way that the resulting circuit is the user-specific circuit desired by the user.

FIG. 1 (Prior Art) is a simplified diagram illustrating an integrated circuit 1, including a plurality of interface cells 2–7, two logic modules 8–9, and four routing channels. A first routing channel extends horizontally adjacent to the top side of integrated circuit 1, a second routing channel extends horizontally adjacent to the bottom side of integrated adjacent to the left side of integrated circuit 1 and intersects with the first and second routing channels, and a fourth routing channel extends vertically adjacent to the right side of integrated circuit 1 and intersects with the first and second routing channels. The logic modules 8 and 9 can be coupled together as desired and coupled to the interface cells 2–7 as desired via interconnect in the routing channels.

It is seen that a portion (a "macrocell") of the routing channel and logic module structure of FIG. 1 is repeated. Macrocell 10 is one such portion and macrocell 11 is another such portion. Macrocell 10, for example, contains the third routing channel, the left-most portion of the first and second routing channels, and a plurality of "antifuses" for connecting selected routing conductors together within the macrocell.

Interface cells 2–7 function to receive incoming data into integrated circuit 1 or to transmit outgoing data from integrated circuit 1. It may be desired that data received into integrated circuit 1 is captured in a register ("registered") first before being processed by other circuitry in the logic modules of the integrated circuit. Alternatively, it may be desired that the data is not registered but rather only goes through combinatorial logic on its way to the logic modules. Because interface cells 2–7 do not include registers, one conventional way to register incoming data is to use registers in logic modules to capture the data. Such use of logic module registers as input registers can, however, cause timing problems due to long propagation delays through the integrated circuit and to the registers inside the logic modules.

Another drawback of using logic module registers as input registers is that the logic modules used for this purpose may not be fully utilized and result in inefficient logic use. It may not be possible to use the other logic elements of a logic module for another purpose once the register is used as an input register. Thus, an entire logic module may be consumed for the purpose of serving as an input register. In situations where multiple bits of data from a bus are to be registered, a large number of logic modules may have to be dedicated to the task of registering the incoming data. This may drastically reduce the number of logic modules available for implementing additional logic.

Each of the small square symbols in FIG. 1 represents a connection element referred to as a "cross antifuse". Cross antifuse 12, for example, can be programmed to form a low impedance connection between horizontally extending routing conductor 13 in the second routing channel and vertically extending routing conductor 14 in the fourth routing channel. Each of the small "X" shaped symbols represents another type of antifuse called a "pass antifuse". Pass antifuse 15, for example, can be programmed to form a low impedance connection between horizontally extending routing conductor 16 and collinearly extending horizontal routing conductor 17. To realize a user-specific circuit on integrated circuit 1, selected ones of these cross and pass antifuses are "programmed" to connect selected routing conductors together. Which antifuses are programmed and which antifuses are left unprogrammed determines how the logic elements in the logic modules are interconnected and therefore determines the resulting circuit.

For background information on field programmable gate arrays employing antifuses, the reader is referred to: the 1994 QuickLogic Data Book, 1994, pages 2–10 through 2–15; the 1995 Actel FPGA Data Book and Design Guide, 1995, pages 1–109 through 1–139, 1–160 through 1–202, 1–229 through 1–269, and 3–17 through 3–41. The contents of these documents are incorporated herein by reference.

FIG. 2 (Prior Art) illustrates an interface cell 18 of an integrated circuit employing antifuses. Interface cell 18 is connectable to a switch box 19 through "pass" antifuses 20–23. Interface cell 18 contains a bonding pad 24, an input buffer 25, an output buffer 26, and a two-input OR gate 27.

A shortcoming of this interface cell structure is that if input buffer 25 is to be coupled to a horizontally extending routing conductor other than routing conductor 28, then more than one antifuse will have to be programmed. Assume that routing conductor 28 is a short segmented routing conductor (one type of routing conductor) and that routing conductor 30 is a relatively long unsegmented routing conductor (another type of routing conductor). If it were desired to couple input buffer 25 to the long type of routing conductor to transmit an incoming signal across the integrated circuit efficiently, then more than one antifuse would have to be programmed.

For example, to connect the output lead of input buffer 25 to routing conductor 30 (the desired type of routing conductor in this example), pass antifuse 20, cross antifuse 32, and cross antifuse 33 are programmed. Conductor 34 is therefore connected to horizontal routing conductor 28, which is connected to vertical routing conductor 35, which is in turn connected to horizontal routing conductor 30. As a result, the structure of FIG. 2 requires three antifuses to be programmed in order to supply an incoming signal onto the desired type of horizontally extending routing conductor.

Moreover, horizontally extending routing conductor 28 is coupled to horizontally extending routing conductor 30 even though it is not the desired horizontal routing conductor. Horizontally extending routing resources are therefore also wasted.

An improved interface cell and interconnect structure is therefore desired.

SUMMARY

An interface cell includes a pad, an input buffer, a first routing conductor, a plurality of second routing conductors, and a plurality of antifuses. The input of the input buffer is coupled to the pad and the output of the input buffer is coupled to the first routing conductor so that an input signal from the pad can be supplied onto the first routing conductor without passing through any programmed antifuses. The second routing conductors extend parallel to one another in a direction perpendicular to the direction in which the first routing conductor extends. The second routing conductors cross the first routing conductor and then pass out of the interface cell and into a routing channel of the programmable integrated circuit. One of the antifuses is disposed at each location where one of the second routing conductors crosses the first routing conductor. Accordingly, an input signal from the pad can be supplied onto any desired one of the second routing conductors of the routing channel by programming only one antifuse.

This summary does not purport to define the invention. The invention is defined by the claims.

DETAILED DESCRIPTION OF THE PREFERRED EMBODIMENTS

Figure 3:
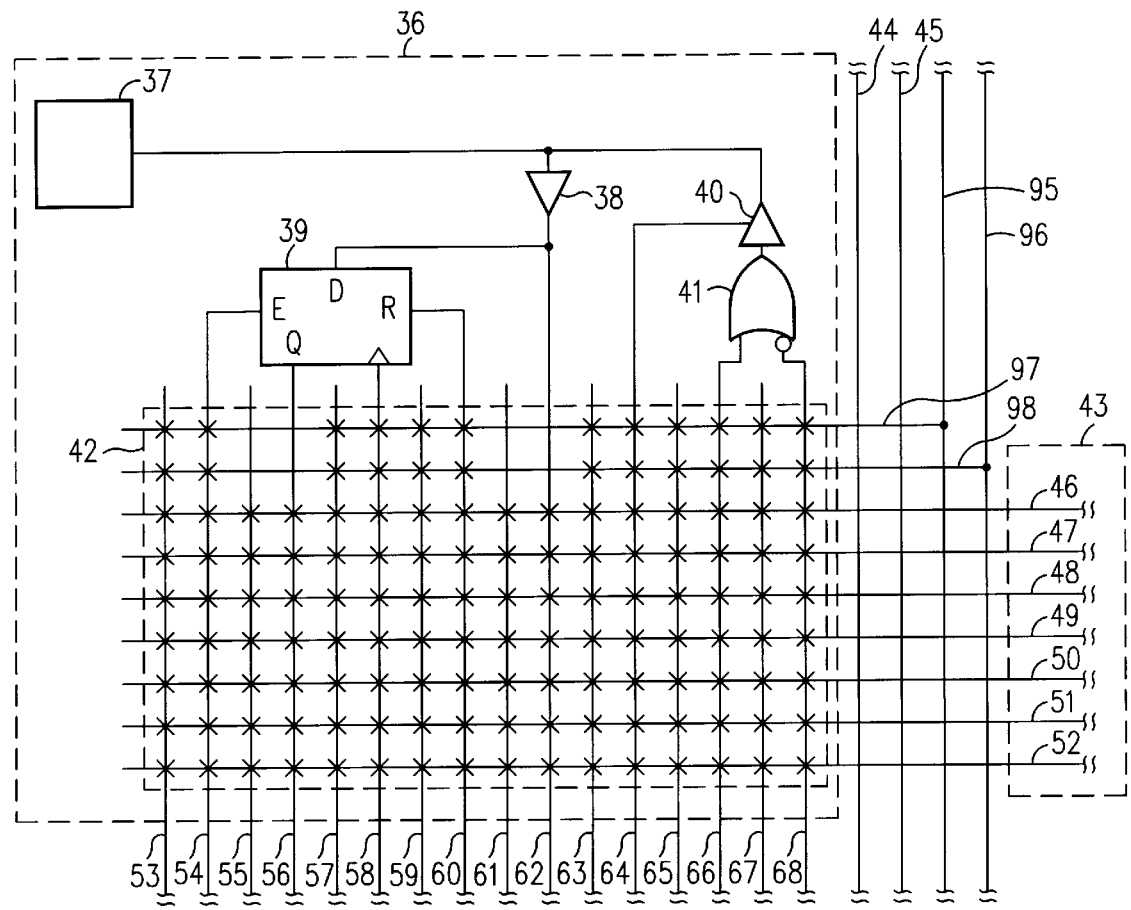
FIG. 3 is a simplified diagram of an interface cell employing antifuses in accordance with the present invention.

FIG. 3 is a simplified diagram of one embodiment of an interface cell 36. Interface cell 36 contains a pad 37, an input buffer 38, a register 39, an output buffer 40, a two-input OR gate 41, and a switch box 42. Interface cell 36 is programmably connectable to the routing conductors of a horizontally extending routing channel 43 and to vertically extending global signal control routing conductors 44 and 45 (see FIG. 5). Horizontally extending routing conductors 46–52 extend from switch box 42 to the right and into horizontally extending routing channel 43. The routing conductors can be made of any suitable conductive material or combination of materials and need not be made of metal.

Switch box 42 comprises a plurality of vertically extending routing conductors 53–68, the left-most portions of routing conductors 46–52, and a plurality of "cross antifuses" (a cross antifuse is represented by the symbol "X"). One such cross antifuse is disposed at each location where one of the horizontally extending routing conductors 46–52 crosses one of the vertically extending routing conductors 53–68.

For instance, there are seven cross antifuses disposed between vertically extending routing conductor 62 and horizontally extending routing conductors 46–52. Each of these antifuses may be programmed to make a direct electrical connection between the output of input buffer 38 and a respective one of the horizontally extending routing conductors 46–52. Horizontally extending routing conductors 46–52 can be the same type of routing conductor or can be different types of routing conductors. Possible types of routing conductors include: short routing conductors that span the length of one logic module, dual routing conductors that span the length of two logic modules, quad routing conductors that span the length of four logic modules, and express bus routing conductors that extend across all the logic modules of the integrated circuit. The ability to couple different types of routing conductors to the output lead of input buffer 38 with one programmed antifuse provides flexibility, compactness and speed in the FPGA architecture. In some embodiments, input buffer 38 sinks up to 16 mA and sources up to 16 mA onto routing conductor 62 for high drive applications. In other embodiments, input buffer 38 sinks up to 8 mA and sources up to 8 mA onto routing conductor 62 for lower drive applications.

Figure 4:
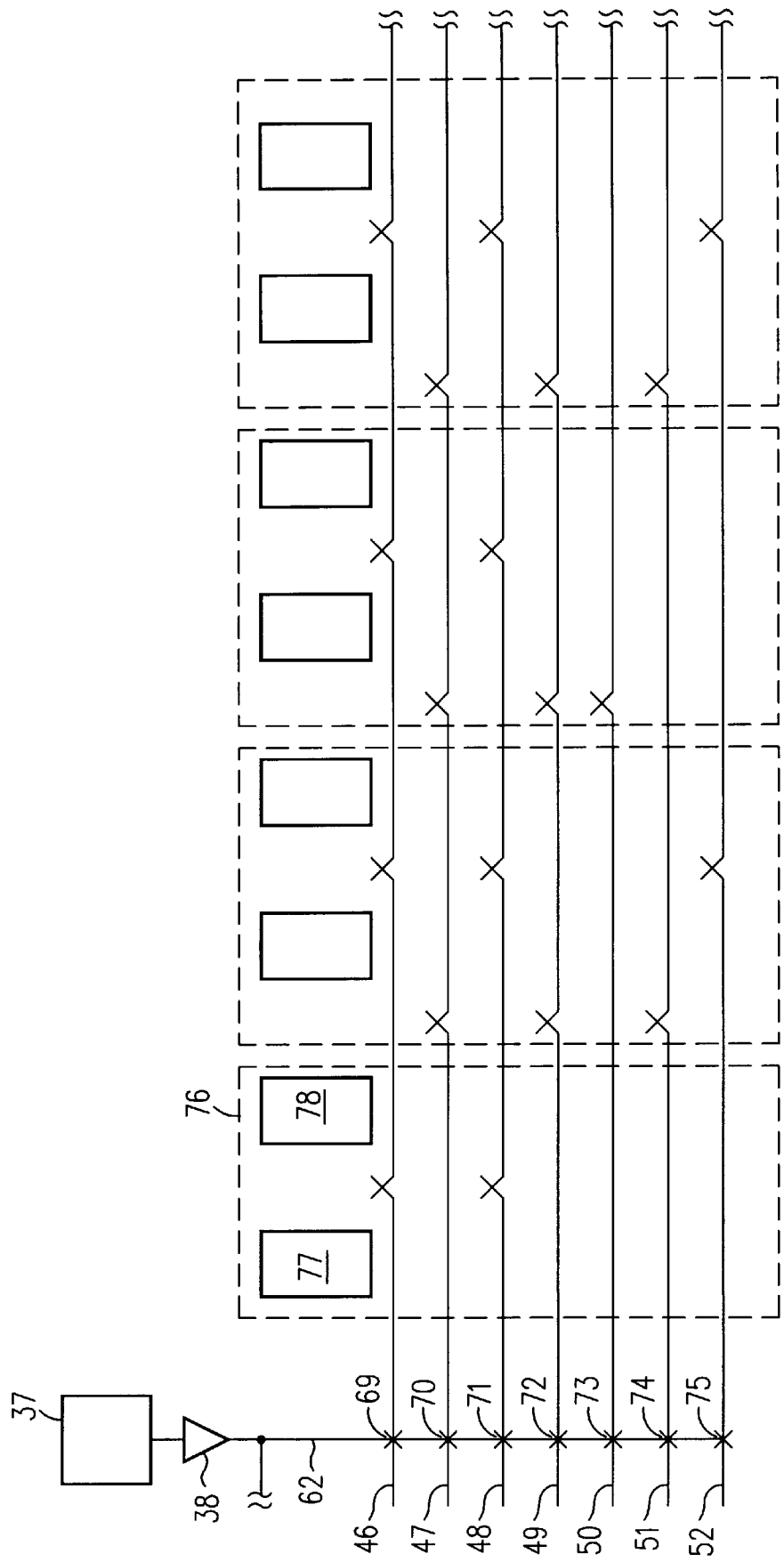
FIG. 4 is a simplified diagram showing how an input buffer can be connected to a routing conductor of a desired type by programming only one antifuse.

FIG. 4 is a simplified diagram showing how the output of input buffer 38 is connectable to different types of horizontal routing conductors in routing channel 43. Vertical routing conductor 62 extends from the output of input buffer 38 and crosses each of the seven horizontally extending routing conductors 46–52. Antifuses 69–75 are disposed at locations where vertical routing conductor 62 crosses the horizontal routing conductors 46–52. An appropriate antifuse of antifuses 69–75 is programmed to connect the output lead of input buffer 38 to a routing conductor of the desired type via one programmed antifuse.

In this embodiment, horizontally extending routing conductors 46–49 are dual routing conductors that span the length of two logic modules. Note that each macrocell in this example contains two logic modules. Macrocell 76, for example, contains logic modules 77 and 78. Horizontally extending routing conductors 50–52 are quad routing conductors that span the length of four logic modules. Although only dual and quad routing conductors are shown in this example, it is understood that any combination of types including, for example, short, dual, quad, and express bus routing conductors can be provided in a routing channel.

Figure 1A:
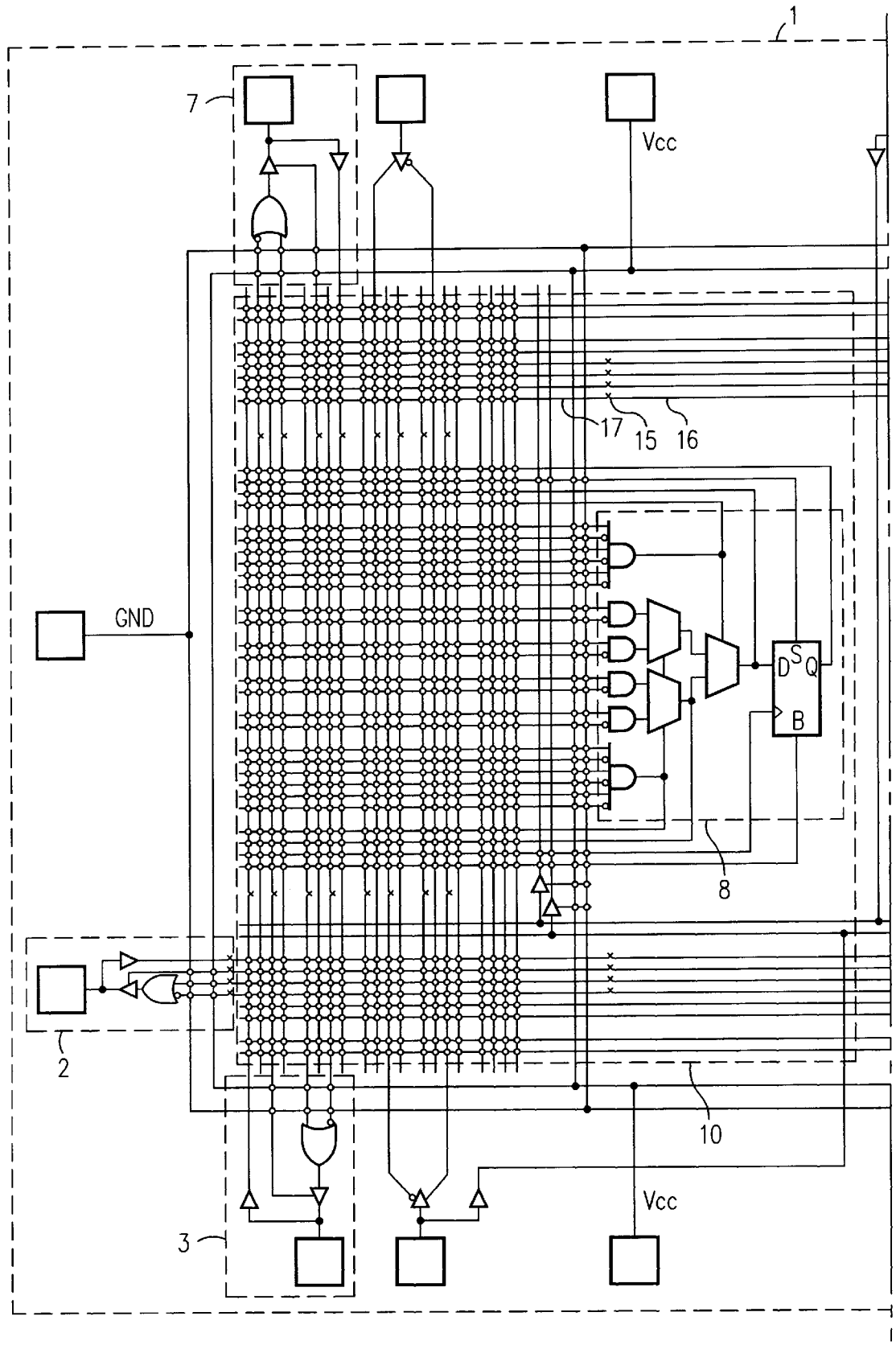
FIG. 1 (Prior Art) is a simplified diagram of a field programmable gate array.
Figure 1B:
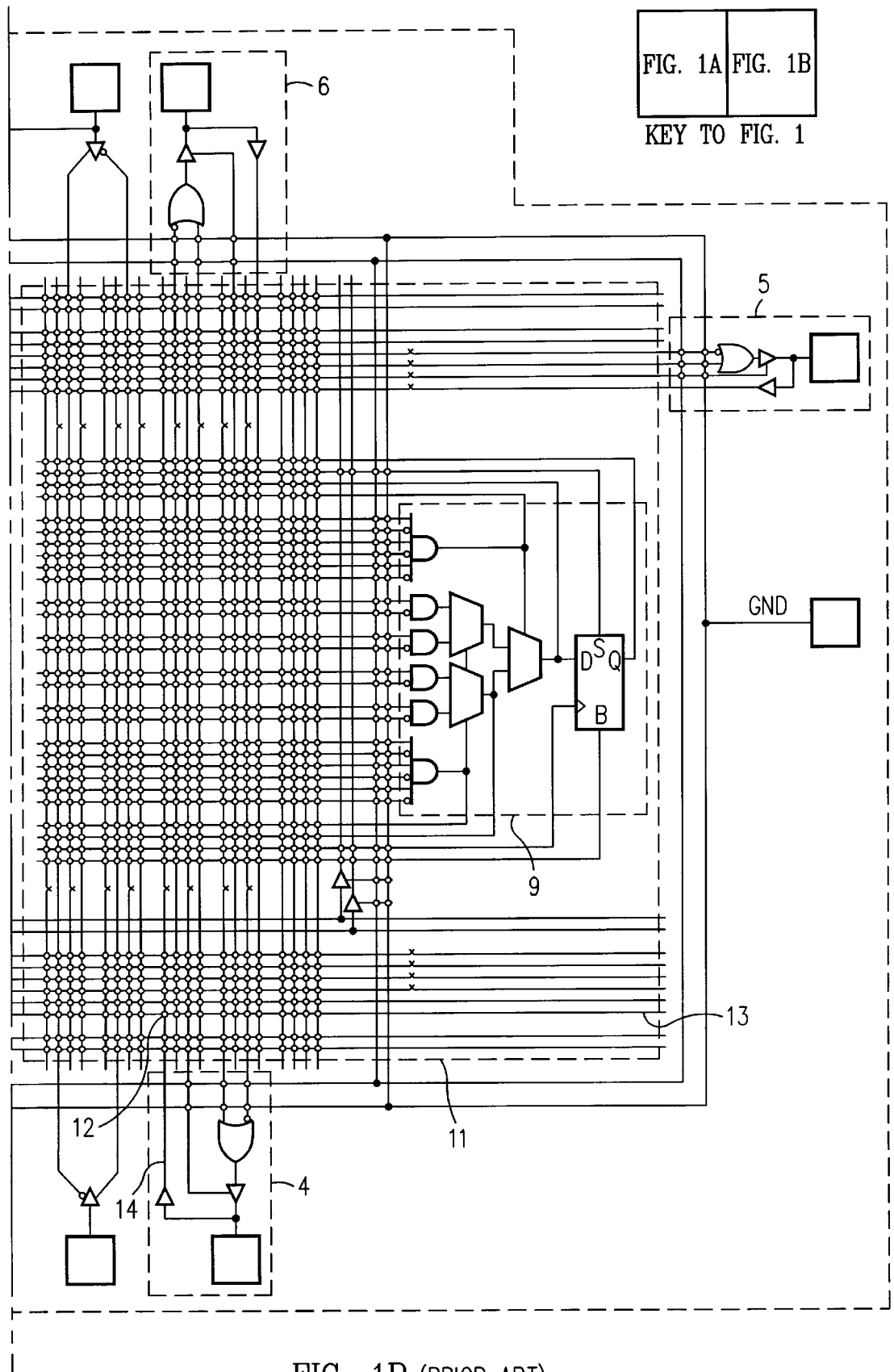
Figure 2:
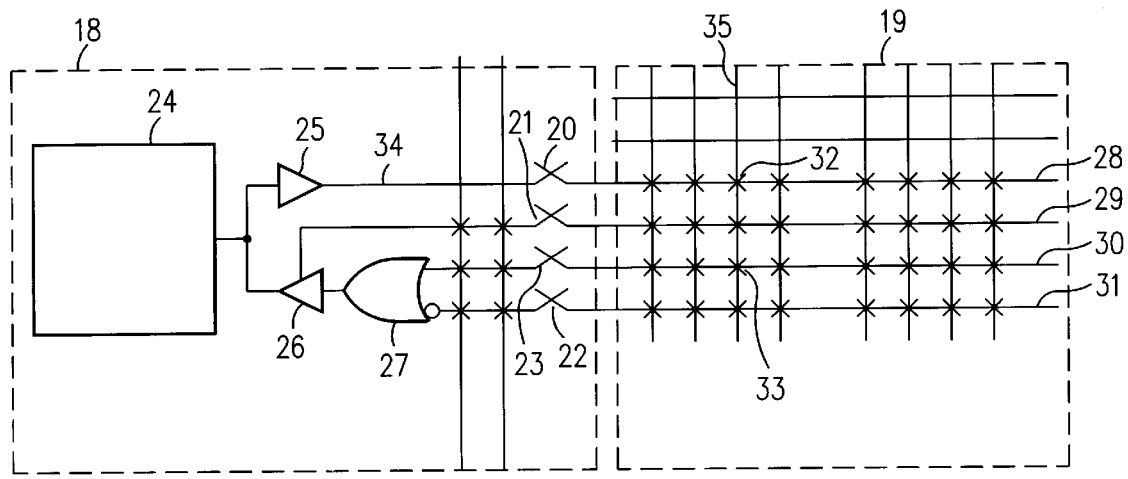
FIG. 2 (Prior Art) is a simplified diagram of an interface cell which can be coupled to routing conductors of a routing channel.

If for example, it is desired to couple the output lead of input buffer 38 to a horizontally extending quad routing conductor, then cross antifuse 75 may be programmed. An input signal received on pad 37 would then only have to pass through one programmed antifuse (antifuse 75) on its way to the quad routing conductor 52. If, on the other hand, it is desired to couple the output lead of input buffer 38 to a horizontally extending dual routing conductor, then cross antifuse 70 may be programmed. Again, an input signal received on pad 37 would also only have to pass through one programmed antifuse (antifuse 70) on its way to the dual routing conductor 47. Accordingly, two horizontally extending routing conductors in the routing channel need not be consumed just to couple an input signal onto a routing conductor of the routing channel as in the prior art example of FIG. 2.

Figure 5:
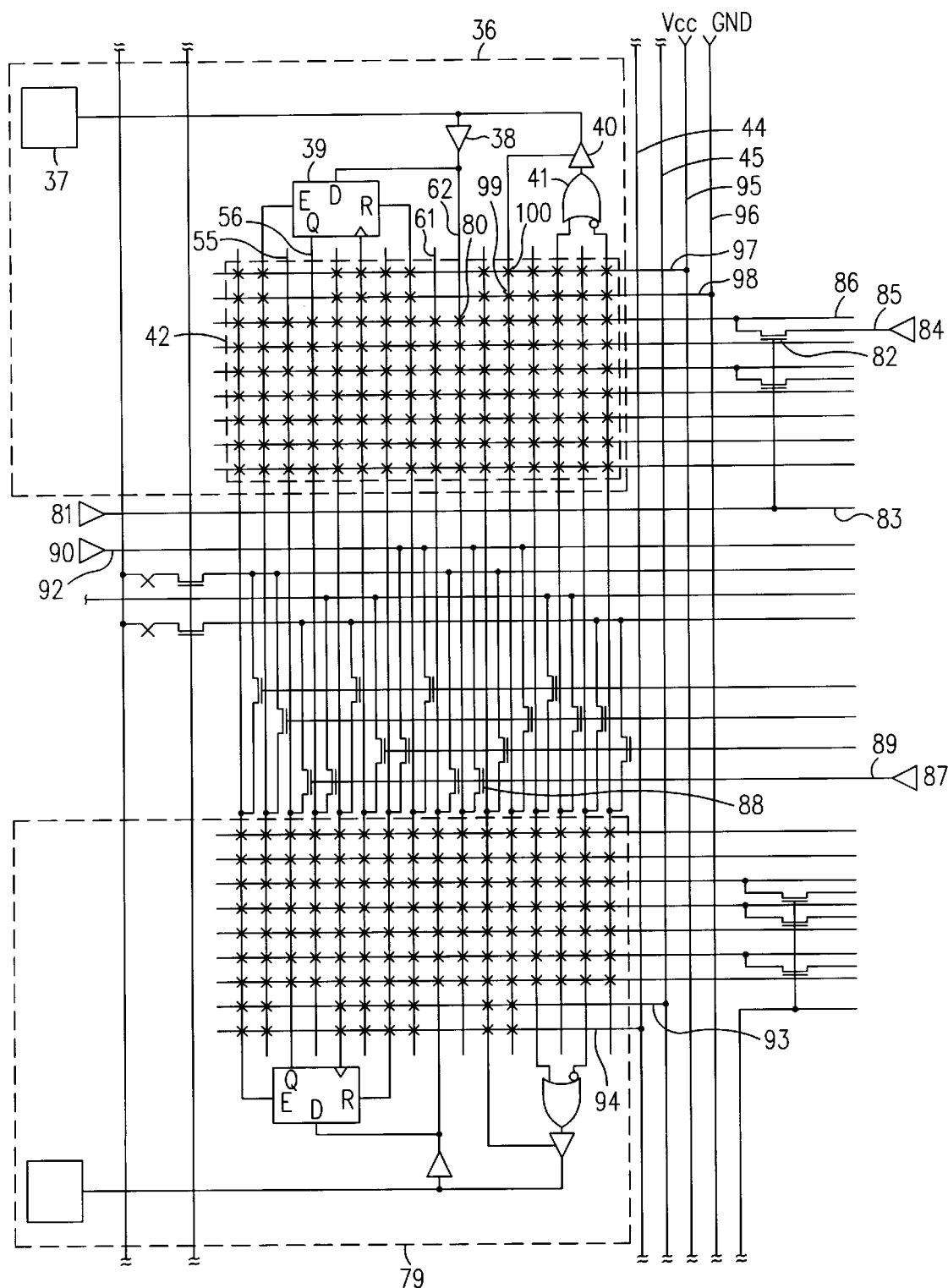
FIG. 5 is a simplified diagram of the programming circuitry associated with an interface cell.

FIG. 5 is a simplified diagram of two interface cells 36 and 79 associated with the same horizontally extending routing channel. Programming control drivers, programming control conductors, programming transistors, programming drivers and programming conductors are provided so that a programming voltage can be supplied to desired horizontally extending and vertically extending routing conductors to program a desired antifuse. For example, to program an antifuse 80, a programming control driver 81 turns ON a programming transistor 82 via programming control conductor 83. A programming driver 84 supplies a programming voltage ($V_{pp}$) via programming conductor 85 and conductive programming transistor 82 to routing conductor 86. Similarly, a programming control driver 87 turns ON a programming transistor 88 via programming control conductor 89. A programming driver 90 grounds routing conductor 62 via programming conductor 92 and conductive programming transistor 88. A programming current therefore flows from programming driver 84, through programming conductor 85 through routing conductor 86, through antifuse 80, through routing conductor 62, through programming conductor 92 and to programming driver 90. As a result, antifuse 80 is programmed. For additional information on the programming structure of an FPGA and how to program an antifuse, see co-pending application Ser. No. 08/667,702, filed Jun. 21, 1996, entitled PROGRAMMING ARCHITECTURE FOR A PROGRAMMABLE INTEGRATED CIRCUIT EMPLOYING ANTIFUSES by Kolze et al. (the subject matter of which is incorporated herein by reference).

As shown in FIG. 5, global signal control routing conductors 44 and 45 and their respective perpendicular branches 93 and 94 are provided, for example, to supply an enable signal to the enable input E of register 39, to supply a clock signal to the clock input of register 39, to supply a reset signal to the reset input of register 39, or to supply an enable signal to the output buffer 40. In addition, perpendicular branches 93 and 94 can be coupled to the inputs of another interface cell 79 disposed opposite switchbox 42.

In some embodiments, the global signal control routing conductors 44 and 45 are driven by dedicated clock/input driver circuitry (not shown) located elsewhere on the integrated circuit. Because vertically extending routing conductors 56 and 62 in interface cell 36 are permanently coupled to outputs of logic elements, vertically extending routing conductors 56 and 62 should not be coupled to the global signal control routing conductors 44 and 45 which are driven by other circuitry. Similarly, because vertically extending routing conductors 55 and 61 are permanently coupled to the Q register output and input buffer output in interface cell 79, vertically extending routing conductors 55 and 61 should not be coupled to the global signal control routing conductors 44 and 45 which are driven by other circuitry. Accordingly, antifuses are not provided at the locations where the branches 93 and 94 of the global signal control routing conductors 44 and 45 cross the vertically extending routing conductors 55–56 and 61–62.

Other conductors 95 and 96 (sometimes called "tie-high-tie-low" conductors) are also provided. Each of these conductors 95 and 96 has perpendicularly extending branches 97 and 98, respectively. Conductors 95 and 96 are provided to enable selected inputs in interface cells 36 and 79 to be permanently coupled to a ground (digital 0) or Vcc (digital 1). Conductor 95 carries Vcc and conductor 96 carries ground potential. If, for example, it is desired to permanently disable output buffer 40, then antifuse 99 would be programmed thereby grounding the enable input lead of output buffer 40. Similarly, if it were desired to permanently enable output buffer 40, then antifuse 100 would be programmed thereby permanently connecting the enable input lead of the output buffer 40 to Vcc.

Figure 6:
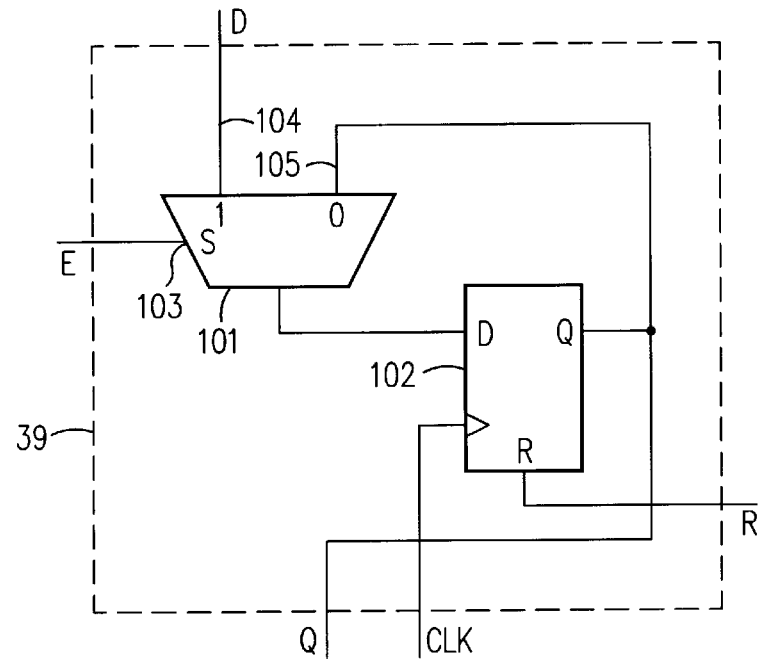
FIG. 6 is a simplified diagram of an enable register in accordance with the embodiment of FIG. 3.

FIG. 6 is a simplified diagram of register 39 of FIG. 3. Register 39 has an enable input lead E, a data input lead D, a reset input lead R, a clock input lead CLK, and a data output lead Q. The internal circuitry of register 39 includes a multiplexer 101 and a D flip-flop 102. Multiplexer 101 has a select input lead 103 coupled to receive an enable signal from enable input lead E, a first data input lead 104 coupled to receive data from data input lead D, a second data input lead 105 coupled to receive the data output from the Q output lead of flip-flop 102, and an output lead which is coupled to the data input lead of flip-flop 102. To "enable" register 39, a digital high is placed on the enable input lead E and on select input lead 103. The D input lead of register 39 is then coupled via the first data input lead 104 of multiplexer 101 to the data input lead of flip-flop 102. Data originating off the integrated circuit can therefore be captured in the flip-flop 102 via pad 37, input buffer 38 and the D input of register 39. To "disable" register 39 (disable the D input), a digital low is placed on select input lead 103. The data output from the Q output lead of flip-flop 102 is then recirculated to the D input lead of flip-flop 102 via the second data input lead 105 of multiplexer 101. Register 39 therefore does not capture new data from pad 37. In some embodiments, the Q output lead of flip-flop 102 sinks up to 16 mA and sources up to 16 mA onto routing conductor 56 for high drive application. In other embodiments, the Q output lead of flip-flop 102 sinks up to 8 mA and sources up to 8 mA onto routing conductor 56 for lower drive application.

Figure 7:
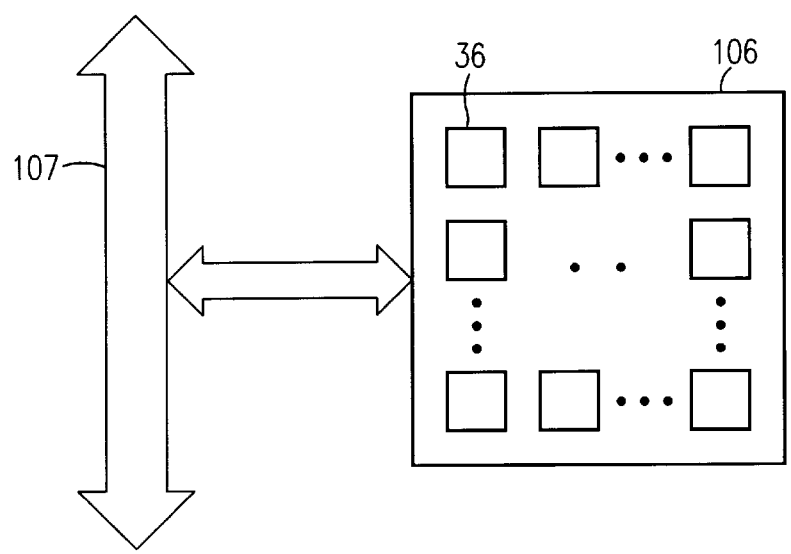
FIG. 7 is a simplified diagram of a field programmable gate array coupled to an external bus.
Figures 1, 8A:
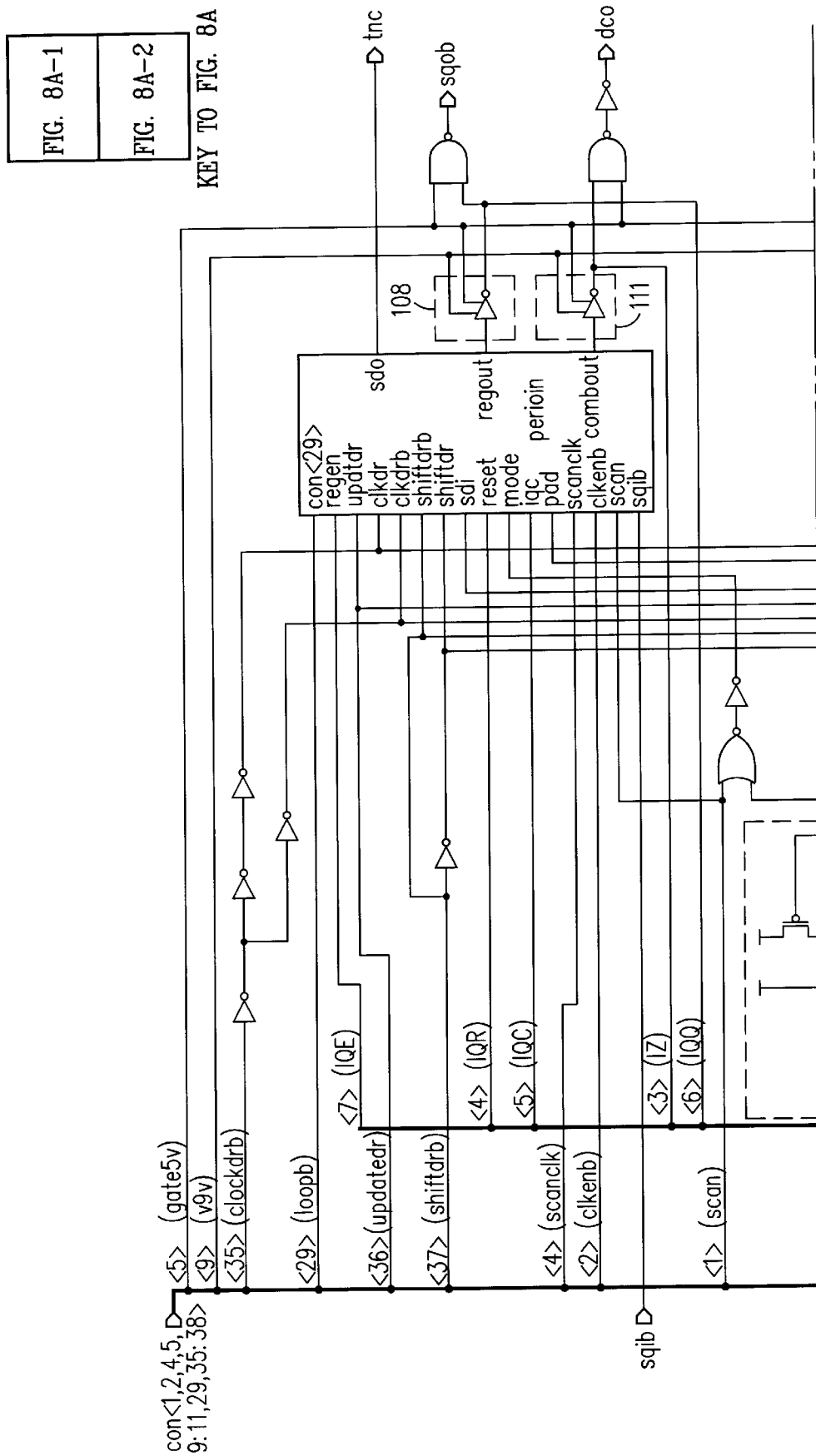
FIGS. 8A–8F, collectively, are a hierarchical schematic of an interface cell in accordance with an embodiment of the present invention.
Figures 2, 8A:
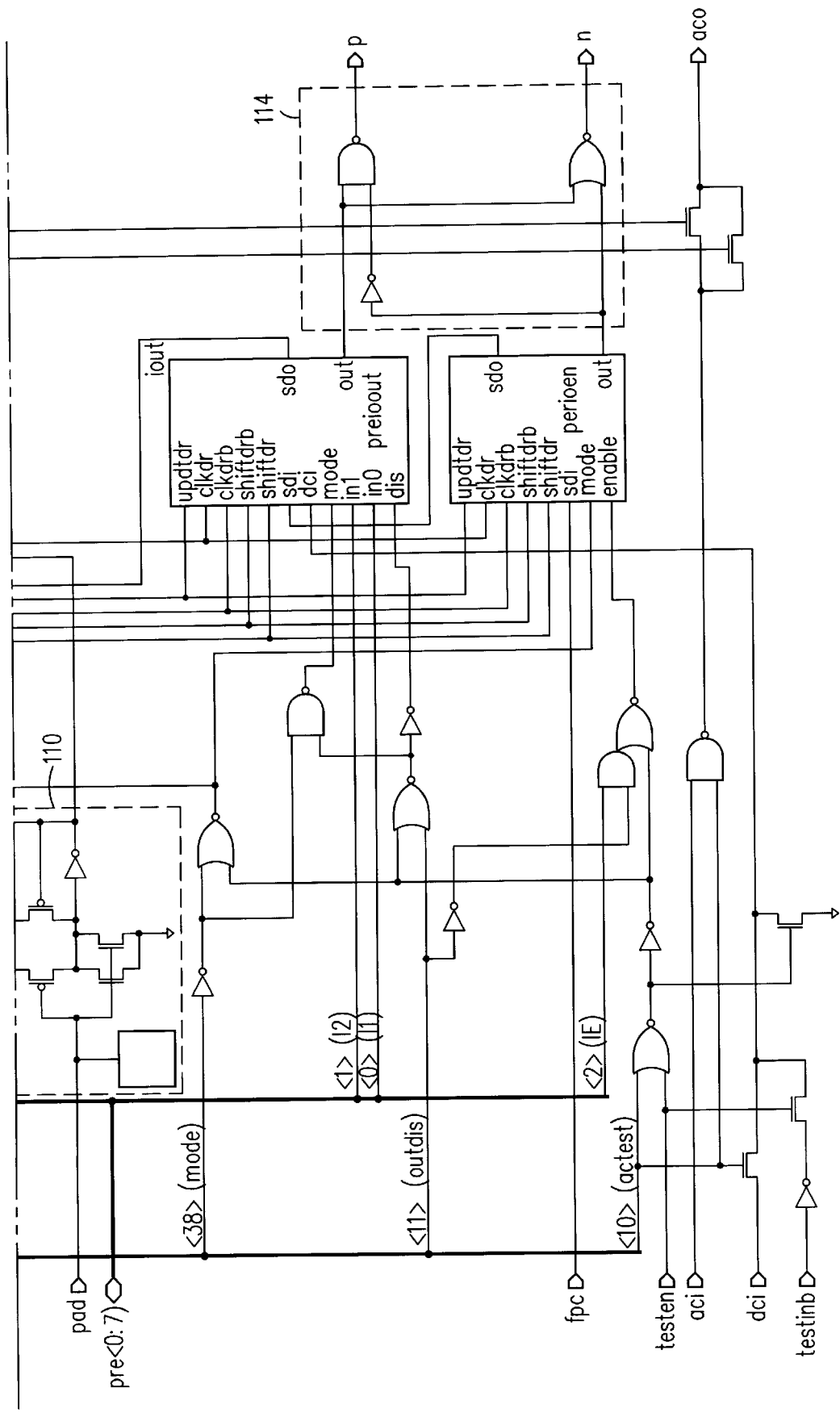
Figures 1, 8B:
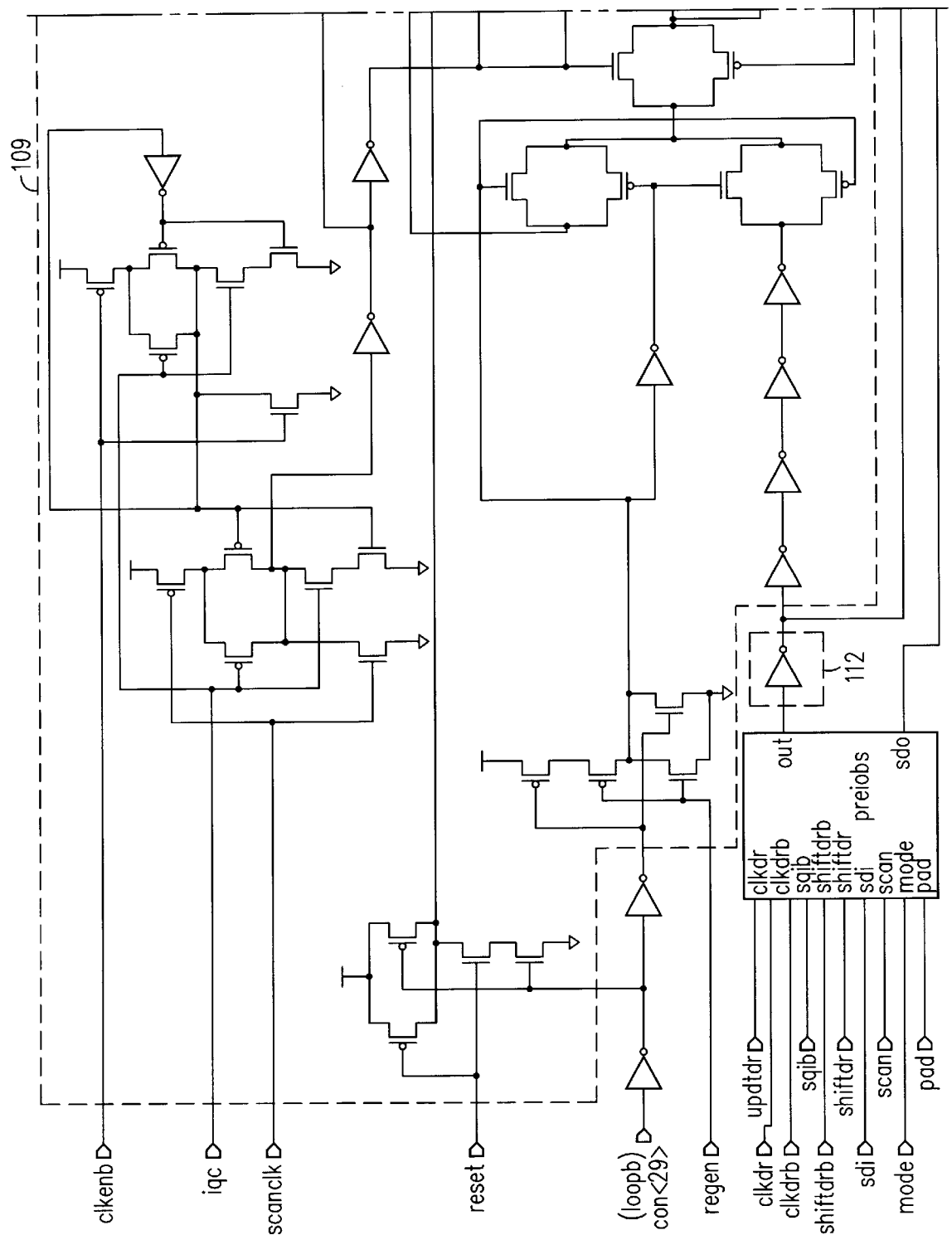
Figure 8C:
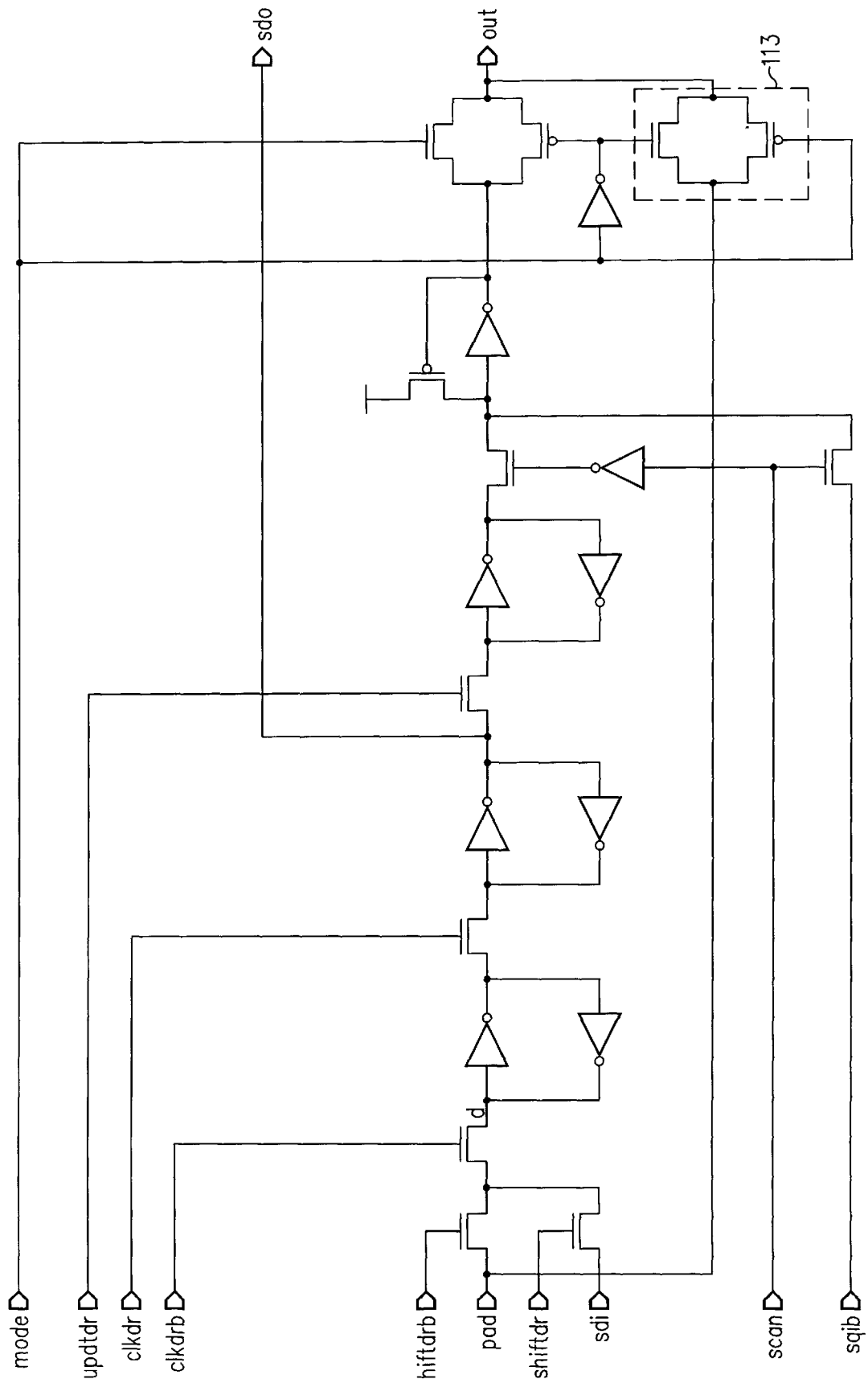
Figure 8D:
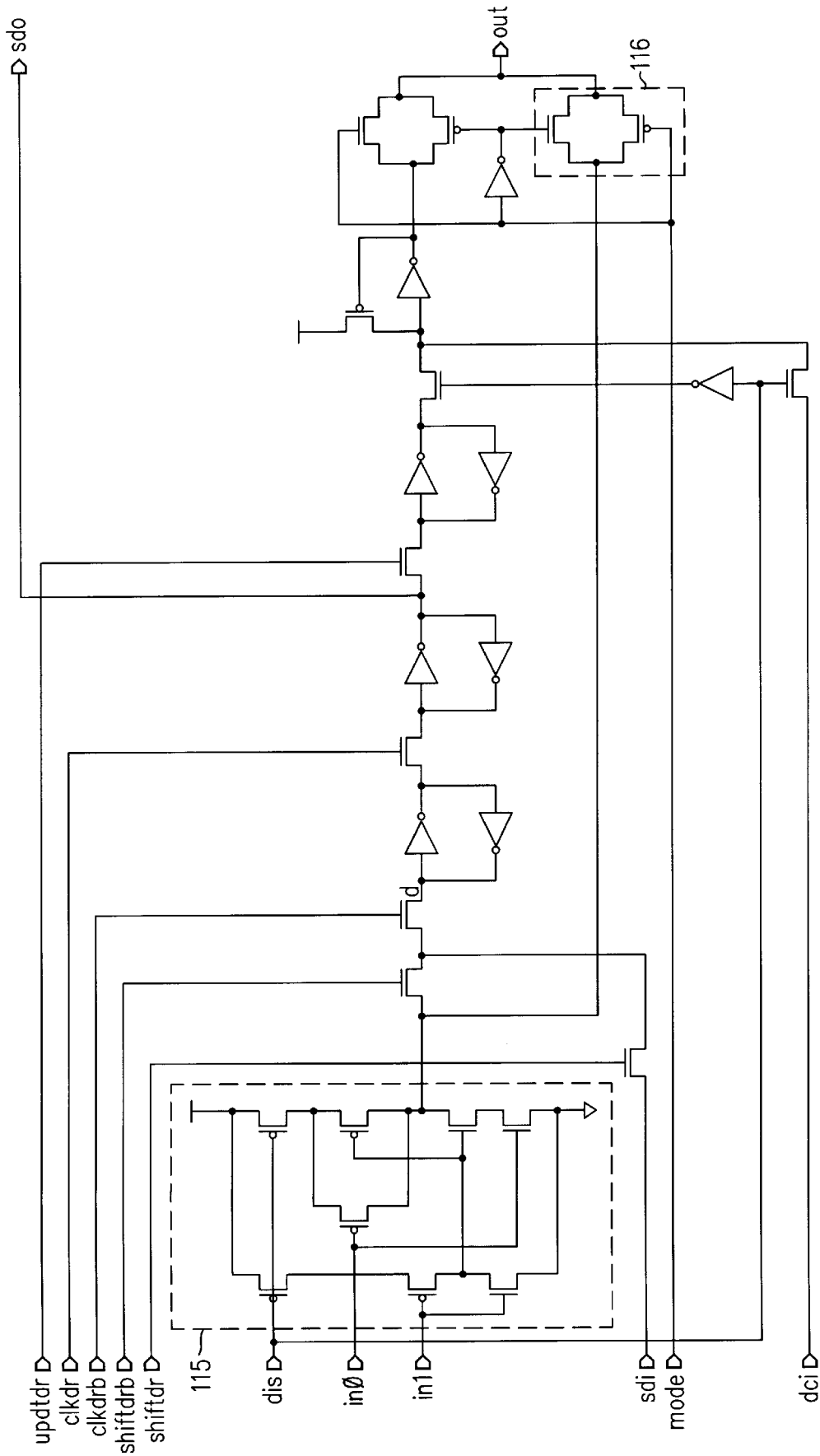
Figure 8E:
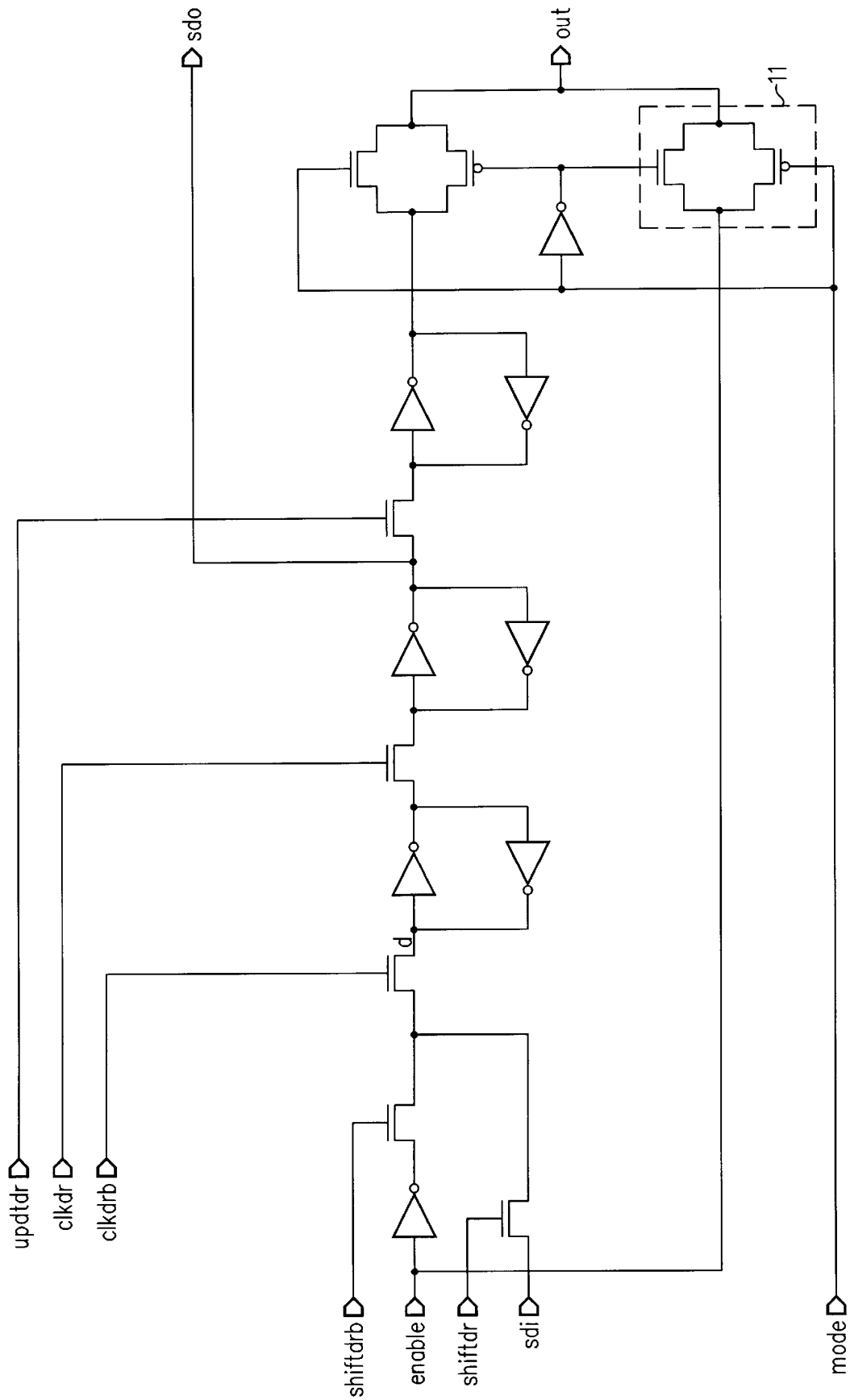
Figure 8F:
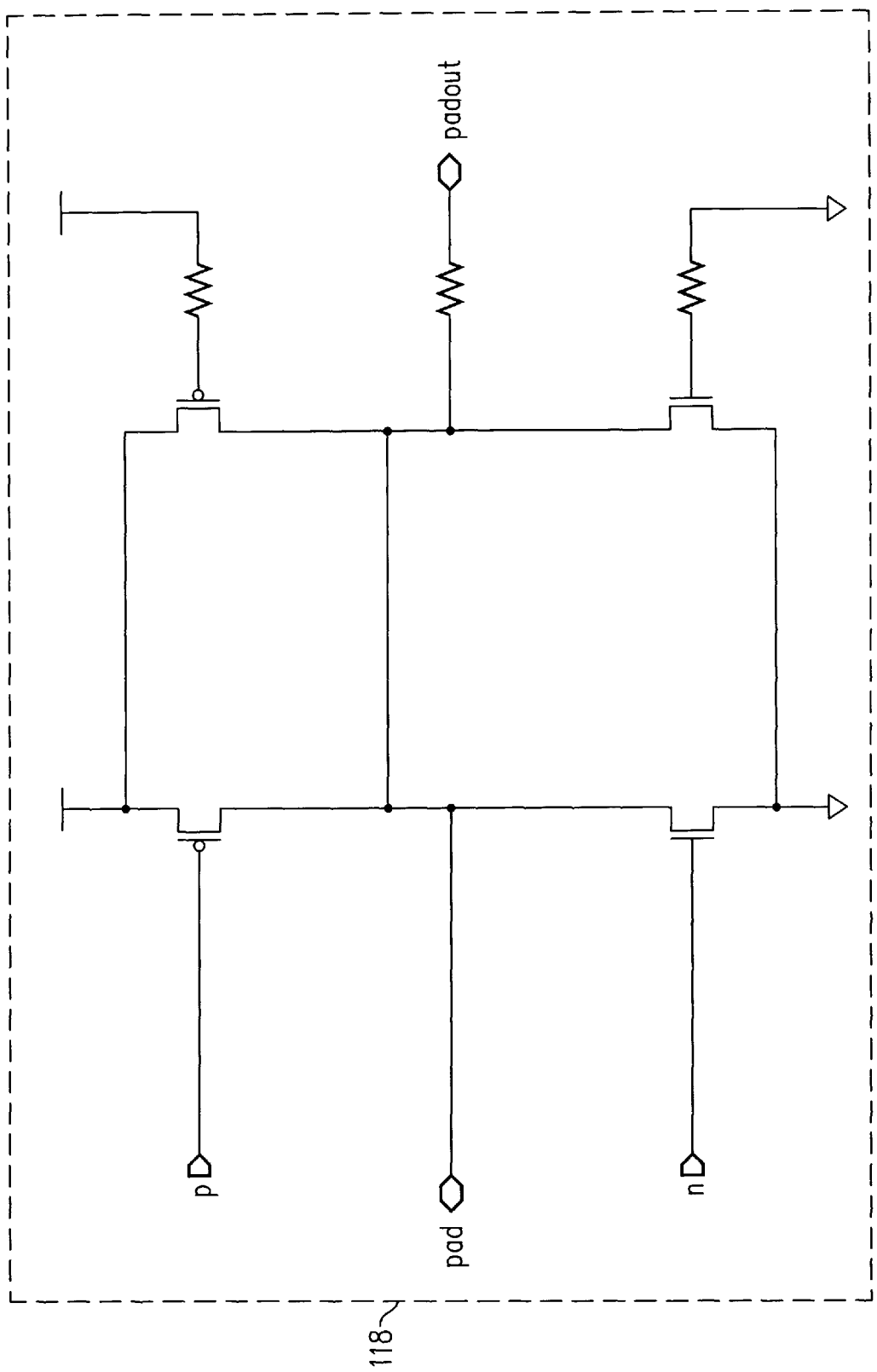

FIG. 7 is a simplified diagram of an FPGA 106 coupled to an external bus 107. When a digital high is placed on the enable input lead E and the clock input lead CLK is supplied with a clock edge, new data from bus 107 is clocked into FPGA 106 and is output to the Q output of register 39. When a digital low is placed on the select input lead of multiplexer 91, new data from bus 107 is prevented from being clocked into FPGA 106 and to the Q output of register 39. Rather, the old data in register 39 is recirculated. Register 39 does not capture new data from bus 107 until a digital high is once again placed on enable input lead E.

By placing register 39 in interface cell 36 relatively close to an edge of the integrated circuit, the propagation delay from pad 37 of the integrated circuit to the data input lead of the registering flip-flop 102 is reduced. Data no longer needs to travel through numerous routing conductors and programmed antifuses in order to reach the data input lead of the registering flip-flop. As a result, the data to clock set up time for the registering flip-flop of the integrated circuit may be reduced.

FIGS. 8A–8F are hierarchical diagrams in accordance with another embodiment. Blocks 108 and 109 correspond with register 39 in FIG. 3. Signals IQE, IQR, IQC, IQQ of FIG. 8A correspond with the input and output leads E, R, CLK, and Q of register 39 of FIG. 5, respectively. Signals I1, I2 and IE of FIG. 8A correspond with the inverting input lead, the non-inverting input lead and the enable input lead of OR gate 41 of FIG. 3, respectively. Blocks 110, 111, 112, and 113 correspond with input buffer 38 in FIG. 3. Blocks 114, 115, 116, 117, and 118 correspond with output buffer 40 and OR gate 41 in FIG. 3.

Although the present invention is described in connection with certain specific embodiments for instructional purposes, the present invention is not limited thereto. The terms horizontal and vertical, top and bottom, upper and lower, and left and right are relative to one another and are otherwise not limiting. When one conductor is said to "cross" another conductor, it is to be understood that this conductor can cross over or cross under the other conductor. The depictions of the various structures in the various diagrams are illustrative. In some embodiments, an interface cell contains no output buffer. The input buffer may have multiple outputs such as an inverting output and a non-inverting output. Aspects of the present invention are not limited to amorphous silicon antifuses but rather extend to other antifuse structures. Accordingly, various modifications, adaptations, and combinations of various features of the described embodiments can be practiced without departing from the scope of the invention as set forth in the following claims.

What is claimed is:

1. A rectangular integrated circuit having four side edges, a first of said side edges extending in a first dimension, said integrated circuit comprising an interface cell and a plurality of logic modules, said plurality of logic modules being disposed in a row, said interface cell comprising:

a pad disposed adjacent said first side edge of said integrated circuit, said pad being closer to said first side edge than to any other one of said four side edges;

a first logic gate having an input lead and an output lead, said input lead coupled to said pad;

a first routing conductor coupled to said output lead of said first logic gate and extending in said first dimension parallel to said first side edge of said integrated circuit;

a plurality of second routing conductors extending parallel to one another in a second dimension perpendicular to said first dimension, at least some of said second routing conductors extending out of said interface cell in said second dimension and past a first of said plurality of logic modules in said row of logic modules; and a plurality of antifuses, a respective one of said plurality of antifuses being disposed at each respective location where said first routing conductor crosses one of said second routing conductors, said first routing conductor extending at each said location in said first dimension parallel to said first side edge of said integrated circuit.

2. The integrated circuit of claim 1, further comprising:

a routing channel, said plurality of second routing conductors extending in said second dimension out of said interface cell and into said routing channel.

3. The integrated circuit of claim 2, wherein said interface cell is disposed at least partly between said first side edge of said integrated circuit and said routing channel.

4. The integrated circuit of claim 2, wherein said routing channel extends in said second dimension adjacent and parallel to said row of logic modules.

5. A rectangular integrated circuit having four side edges and comprising an interface cell, said interface cell comprising:

a pad, a first of said four side edges being closer to said pad than any other one of said four side edges, said first side edge extending in a first dimension;

a first logic gate having an input lead and an output lead, said input lead coupled to said pad;

a first routing conductor coupled to said output lead of said first logic gate and extending in said first dimension parallel to said first side edge;

a plurality of second routing conductors extending in parallel to one another in a second dimension perpendicular to said first dimension; and a first plurality of antifuses, a respective one of said first plurality of antifuses being disposed at each respective location where said first routing conductor crosses one of said second routing conductors, wherein said interface cell further comprises a register having an enable input.

6. An integrated circuit comprising an interface cell, said interface cell comprising:

a pad;

a first logic gate having an input lead and an output lead, said input lead coupled to said pad;

a first routing conductor coupled to said output lead of said first logic gate and extending in a first dimension;

a plurality of second routing conductors extending parallel to one another in a second dimension perpendicular to said first dimension;

a first plurality of antifuses, a respective one of said first plurality of antifuses being disposed at each respective location where said first routing conductor crosses one of said second routing conductors, wherein said interface cell further comprises a register having an enable input;

a third routing conductor extending in said first dimension and being coupled to said enable input of said register; and a second plurality of antifuses, a respective one of said second plurality of antifuses being disposed at each respective location where said third routing conductor crosses one of said second routing conductors.

7. The integrated circuit of claim 6, wherein said interface cell simultaneously generates a first signal from said register and a second signal from said first logic gate.

8. A rectangular integrated circuit having four side edges and comprising:

a pad, a first of said four side edges being closer to said pad than any other one of said four side edges, said first side edge extending in a first dimension;

a first logic gate having an input lead and an output lead, said input lead coupled to said pad;

a first routing conductor coupled to said output lead of said first logic gate and extending in said first dimension parallel to said first side edge;

a plurality of second routing conductors extending in parallel to one another in a second dimension perpendicular to said first dimension;

a first plurality of antifuses, a respective one of said first plurality of antifuses being disposed at each respective location where said first routing conductor crosses one of said second routing conductors; and a third routing conductor extending in said second dimension and crossing said first routing conductor at a location, no antifuse being disposed at said location.

9. The integrated circuit of claim 8, wherein said interface cell further comprises:

a fourth routing conductor extending in said first dimension and crossing said third conductor at a location, no antifuses being disposed at said location.

10. The integrated circuit of claim 1, wherein said first logic gate is a non-inverting buffer.

11. The integrated circuit of claim 1, wherein said first logic gate is an inverting buffer.

12. The integrated circuit of claim 1, wherein said input lead of said first logic gate is substantially directly connected to said pad.

13. The integrated circuit of claim 1, wherein said interface cell further comprises:

a second logic gate coupled to a common node, said common node coupled to said pad and said first logic gate.

14. A rectangular integrated circuit having four side edges and comprising an interface cell, said interface cell comprising:

a pad, a first of said four side edges being closer to said pad than any other one of said four side edges, said first side edge extending in a first dimension;

a first logic gate having an input lead and an output lead, said input lead coupled to said pad;

a first routing conductor coupled to said output lead of said first logic gate and extending in said first dimension parallel to said first side edge;

a plurality of second routing conductors extending in parallel to one another in a second dimension perpendicular to said first dimension;

a first plurality of antifuses, a respective one of said first plurality of antifuses being disposed at each respective location where said first routing conductor crosses one of said second routing conductors;

a second logic gate coupled to a common node, said common node coupled to said pad and said first logic gate; and a third routing conductor extending in said second dimension and crossing said first routing conductor at a location, no antifuse being disposed at said location.

15. The integrated circuit of claim 14, wherein said interface cell further comprises:

a third routing conductor coupled to said non-inverting input lead, said third routing conductor extending in said first dimension and crossing said plurality of second routing conductors.

16. The integrated circuit of claim 15, wherein said interface cell further comprises:

a fourth routing conductor coupled to said inverting input lead, said fourth routing conductor extending in said first dimension and crossing said plurality of second routing conductors.

17. An integrated circuit comprising an interface cell, said interface cell comprising:

a pad;

a first logic gate having an input lead and an output lead, said input lead coupled to said pad;

a first routing conductor coupled to said output lead of said first logic gate and extending in a first dimension;

a plurality of second routing conductors extending parallel to one another in a second dimension perpendicular to said first dimension;

a first plurality of antifuses, a respective one of said first plurality of antifuses being disposed at each respective location where said first routing conductor crosses one of said second routing conductors; and a second interface cell, said second interface cell comprising a logic gate, said first logic gate of said interface cell being capable of sinking at least twice as much current as said logic gate of said second interface cell.

18. An integrated circuit comprising an interface cell, said interface cell comprising:

a pad;

a first logic gate having an input lead and an output lead, said input lead coupled to said pad;

a first routing conductor coupled to said output lead of said first logic gate and extending in a first dimension;

a plurality of second routing conductors extending parallel to one another in a second dimension perpendicular to said first dimension;

a first plurality of antifuses, a respective one of said first plurality of antifuses being disposed at each respective location where said first routing conductor crosses one of said second routing conductors; and a second interface cell, said second interface cell comprising a logic gate, said first logic gate of said interface cell being capable of sourcing at least twice as much current as said logic gate of said second interface cell.

19. An integrated circuit comprising an interface cell, said interface cell coprising:

a pad;

a first logic gate having an input lead and an output lead, said input lead coupled to said pad;

a first routing conductor coupled to said output lead of said first logic gate and extending in a first dimension;

a plurality of second routing conductors extending parallel to one another in a second dimension perpendicular to said first dimension;

a first plurality of antifuses, a respective one of said first plurality of antifuses being disposed at each respective location where said first routing conductor crosses one of said second routing conductors; and a register having an enable input and an output;

the integrated circuit further comprising: a second interface cell, said second interface cell comprising a register having an output, wherein said output of said register of said interface cell is capable of sourcing at least twice as much current as said output of said register of said second interface cell.

20. An integrated circuit comprising an interface cell, said interface cell comprising:

a pad;

a first logic gate having an input lead and an output lead, said input lead coupled to said pad;

a first routing conductor coupled to said output lead of said first logic gate and extending in a first dimension;

a plurality of second routing conductors extending parallel to one another in a second dimension perpendicular to said first dimension;

a first plurality of antifuses, a respective one of said first plurality of antifuses being disposed at each respective location where said first routing conductor crosses one of said second routing conductors; and a register having an enable input and an output;

the integrated circuit further comprising: a second interface cell, said second interface cell comprising a register having an output, wherein said output of said register of said interface cell is capable of sinking at least twice as much current as said output of said register of said second interface cell.

21. A field programmable gate array comprising antifuses, comprising:

a pad disposed adjacent a side of said field programmable gate array;

a row of logic modules extending in a direction perpendicular to said side of said field programmable gate array;

a routing channel extending parallel to said row of logic modules, said routing channel comprising a plurality of routing conductors A; and means for supplying an input signal on said pad onto a selected one of said routing conductors A such that said input signal passes through one and only one programmed antifuse between said pad and said selected one of said routing conductors A.

22. The field programmable gate array of claim 21, wherein said means for supplying comprises:

a routing conductor B extending in a direction perpendicular to a direction in which said plurality of routing conductors A extends, said routing conductor B crossing each of said routing conductors A;

an input buffer having an input lead coupled to said pad and an output lead coupled to said routing conductor B; and a plurality of antifuses, a respective one of said antifuses being disposed at each location where said routing conductor B crosses one of said routing conductors A.

23. The field programmable array of claim 21, further comprising:

means for supplying an output signal onto said pad from a selected one of said routing conductors A.

24. An integrated circuit comprising a plurality of interface cells, a plurality of routing channels, and a plurality of logic modules, each of said interface cells having a register with a clock input, wherein the clock input of a first of said interface cells is couplable to a selected one of at least eight parallel extending routing conductors A by programming a single antifuse A, and wherein the clock input of a second of said interface cells is couplable to a selected one of at least eight parallel extending routing conductors B by programming a single antifuse B, said routing conductors A being different routing conductors from said routing conductors B.

25. An integrated circuit comprising an interface cell and a routing channel, said interface cell comprising a pad and a register, wherein a first signal path can be established from said pad through a first programmed antifuse to a first routing conductor in said routing channel without passing through said register, and wherein a second signal path can be established from said pad through a second programmed antifuse to a second routing conductor in said routing channel through said register, wherein said first and second signal paths can exist simultaneously.

26. The integrated circuit of claim 25, wherein said first signal path can be established by programming a single antifuse A, and wherein said second signal path can be established by programming a single antifuse B.

27. An integrated circuit comprising a plurality of interface cells and a plurality of routing conductors, each of said interface cells having a register, each of the registers having a data output driver, wherein the data output driver of the register of a first of said interface cells is capable of outputting at least twice as much current onto a routing conductor as the data output driver of the register of a second of said interface cells is capable of outputting onto a routing conductor.

28. A field programmable gate array, comprising:

a first interface cell disposed adjacent a side of said field programmable gate array and having one and only one pad;

a second interface cell disposed adjacent said side of said field programmable gate array and having one and only one pads said second interface cell being disposed adjacent said first interface cell with no interface cell disposed between the first interface cell and the second interface cell;

a first plurality of conductors extending parallel to one another from said first interface cell to said second interface cell, said first plurality of conductors not extending into any other interface cell of said field programmable gate array, said first plurality of conductors extending parallel to said side of said field programmable gate array;

a second plurality of conductors extending parallel to one another in a direction perpendicular to said side of said field programmable gate array and crossing said first plurality of conductors in said first interface cell;

first antifuses disposed where said second plurality of conductors cross said first plurality of conductors in said first interface cell;

a third plurality of conductors extending parallel to one another in a direction perpendicular to said side of said field programmable gate array and crossing said first plurality of conductors in said second interface cell;

second antifuses disposed where said third plurality of conductors cross said first plurality of conductors in said second interface cell; and a row of macrocells extending away from said first plurality of conductors, said first plurality of conductors not extending into any one of said macrocells, said row of macrocells extending in said direction perpendicular to said side of said field programmable gate array, each of said macrocells comprising a logic cell.

* * * * *